US010281538B2

(12) United States Patent
Mathieu et al.

(10) Patent No.: US 10,281,538 B2
(45) Date of Patent: May 7, 2019

(54) WARM BORE CYLINDER ASSEMBLY

(75) Inventors: Jean-Baptiste Mathieu, Clifton Park, NY (US); Evangelos Trifon Laskaris, Schenectady, NY (US); Kenneth William Rohling, Troy, NY (US); Minfeng Xu, Ballston Lake, NY (US); Seung-Kyun Lee, Cohoes, NY (US)

(73) Assignee: General Electric Company, Schenectady, NY (US)

( * ) Notice: Subject to any disclaimer, the term of this patent is extended or adjusted under 35 U.S.C. 154(b) by 1614 days.

(21) Appl. No.: 13/603,903

(22) Filed: Sep. 5, 2012

(65) Prior Publication Data
US 2014/0061202 A1 Mar. 6, 2014

(51) Int. Cl.
*G01R 33/38* (2006.01)
*G01R 33/421* (2006.01)
*G01R 33/3815* (2006.01)
*G01R 33/3873* (2006.01)

(52) U.S. Cl.
CPC ..... *G01R 33/3804* (2013.01); *G01R 33/3873* (2013.01); *G01R 33/38* (2013.01); *G01R 33/3815* (2013.01); *G01R 33/421* (2013.01); *G01R 33/4215* (2013.01); *Y10T 29/49359* (2015.01)

(58) Field of Classification Search
USPC .......................... 324/300–322; 600/407–435
See application file for complete search history.

(56) References Cited

U.S. PATENT DOCUMENTS

| 4,771,244 | A | 9/1988 | Vermilyea |
| 5,736,859 | A | 4/1998 | Gore |
| 5,744,958 | A | 4/1998 | Werne |
| 6,707,302 | B2 | 3/2004 | Ries |
| 6,819,107 | B2 * | 11/2004 | Heid ............. G01R 33/385 324/318 |
| 6,853,855 | B2 | 2/2005 | Ideler |

(Continued)

FOREIGN PATENT DOCUMENTS

| CN | 101063707 A | 10/2007 |
| CN | 102420038 A | 4/2012 |

(Continued)

OTHER PUBLICATIONS

GB Search Report issued Mar. 19, 2014 in connection with corresponding GB Patent Application No. GB1315631.0.

(Continued)

*Primary Examiner* — Melissa J Koval
*Assistant Examiner* — Tiffany A Fetzner
(74) *Attorney, Agent, or Firm* — Ernest G. Cusick

(57) ABSTRACT

A warm bore cylinder assembly having an outer wall, an inner wall, and a plurality of braces is provided. The outer wall is configured to define an inner exterior portion of a cryostat assembly. The outer wall is generally cylindrical, is made of a conductive material, and has an outer wall thickness. The inner wall is disposed radially inwardly of the outer wall. The inner wall is generally cylindrical, is made of a conductive material, and has an inner wall thickness. The braces extend along an axial direction defined by the outer wall and the inner wall. The plurality of braces are interposed between and join the outer wall and inner wall. The plurality of braces define openings disposed between adjacent braces.

10 Claims, 8 Drawing Sheets

(56) References Cited

U.S. PATENT DOCUMENTS

| | | | | |
|---|---|---|---|---|
| 6,867,592 B2* | 3/2005 | Gebhardt | ............ | G01R 33/3873 324/309 |
| 7,459,908 B2 | 12/2008 | Juchem | | |
| 7,495,544 B2 | 2/2009 | Heid | | |
| 7,508,209 B2* | 3/2009 | Dietz | ................ | G01R 33/3856 324/306 |
| 7,514,928 B2 | 4/2009 | Westphal | | |
| 7,589,531 B2* | 9/2009 | Yamashita | ......... | G01R 33/3856 324/318 |
| 7,800,368 B2* | 9/2010 | Vaughan | ............ | G01R 33/5612 324/318 |
| 7,884,605 B2* | 2/2011 | Tamura | ............. | G01R 33/3815 324/318 |
| 8,525,116 B2* | 9/2013 | Schulz | ................ | G01T 1/1603 250/363.02 |
| 8,536,870 B2* | 9/2013 | Punchard | ........... | G01R 33/3875 324/319 |
| 8,552,726 B2* | 10/2013 | Sakakura | ........... | G01R 33/3854 324/318 |
| 8,575,934 B2* | 11/2013 | Iwasa | ................ | G01R 33/3873 324/318 |
| 8,604,793 B2* | 12/2013 | Shen | ................. | G01R 33/3873 324/319 |
| 9,013,255 B2* | 4/2015 | Tanabe | .............. | G01R 33/3873 324/318 |
| 9,488,704 B2* | 11/2016 | Hierl | ...................... | G01R 33/28 |
| 9,500,729 B2* | 11/2016 | Dietz | ..................... | G01R 33/28 |
| 9,638,780 B2* | 5/2017 | Ookawa | ............... | G01R 33/543 |
| RE47,026 E* | 9/2018 | Vaughan | ............ | G01R 33/5612 |
| 2003/0206018 A1* | 11/2003 | Gebhardt | ........... | G01R 33/3873 324/318 |
| 2003/0218460 A1* | 11/2003 | Heid | .................... | G01R 33/385 324/318 |
| 2005/0204751 A1 | 9/2005 | White et al. | | |
| 2006/0001425 A1 | 1/2006 | Weyers et al. | | |
| 2006/0262826 A1* | 11/2006 | Dietz | ................ | G01R 33/3873 372/96 |
| 2008/0129298 A1* | 6/2008 | Vaughan | ............ | G01R 33/5612 324/322 |
| 2008/0197850 A1 | 8/2008 | Dietz et al. | | |
| 2009/0009171 A1* | 1/2009 | Tamura | ............... | G01R 33/3873 324/320 |
| 2011/0006769 A1* | 1/2011 | Iwasa | ................. | G01R 33/3873 324/309 |
| 2011/0074419 A1* | 3/2011 | Sakakura | ........... | G01R 33/3854 324/318 |
| 2011/0260727 A1* | 10/2011 | Punchard | ........... | G01R 33/3875 324/318 |
| 2012/0098538 A1* | 4/2012 | Shen | ................... | G01R 33/3873 324/318 |
| 2012/0124798 A1* | 5/2012 | Tanabe | ............... | G01R 33/3873 29/404 |
| 2013/0314089 A1* | 11/2013 | Katsunuma | ........ | G01R 33/3854 324/322 |
| 2014/0061202 A1* | 3/2014 | Mathieu | ............. | G01R 33/3804 220/560.09 |

FOREIGN PATENT DOCUMENTS

| | | |
|---|---|---|
| CN | 103620436 A | 3/2014 |
| GB | 2487813 A | 8/2012 |
| GB | 2505207 A | 2/2014 |

OTHER PUBLICATIONS

Edelstein et al.; "Making MRI Quieter"; 2002 Elsevier Science Inc.—Magnetic Resonance Imaging 20; pp. 155-163; 2002.

Kidane et al.; "Active-Passive Shielding for MRI Acoustic Noise Reduction: Network Analysis"; IEEE Transactions on Magnetics; vol. 42; No. 12; pp. 3854-3860; Dec. 2006.

Rausch et al.; "Computer-Aided Design of Clinical Magnetic Resonance Imaging Scanners by Coupled Magnetomechanical-Acoustic Modeling"; IEEE Transactions on Magnetics; vol. 41; No. 1; pp. 72-81; Jan. 2005.

First Office Action and Search issued in connection with corresponding CN Appl. No. 201310398887.X dated May 15, 2017.

* cited by examiner 400 (End view of a segment)
402 (Segment outer wall)
404 (Segment inner wall)
406 (Braces)
408 (End walls)
401 (Angle subtended by segment 400)
410 (Openings between braces 406 and between brace 406 and adjacent end wall 408)
412 (Coolant openings)
414 (Notch in end wall 408 of the segment 400)
415 (Tab in opposite end wall 408)
417 (Chamfers in end walls 408)
416 (Thickness of segment outer wall 402)
418 (Thickness of segment inner wall 404)
420 (Distance between segment outer wall 402 and segment inner wall 404)
430 (Shim tray surface)

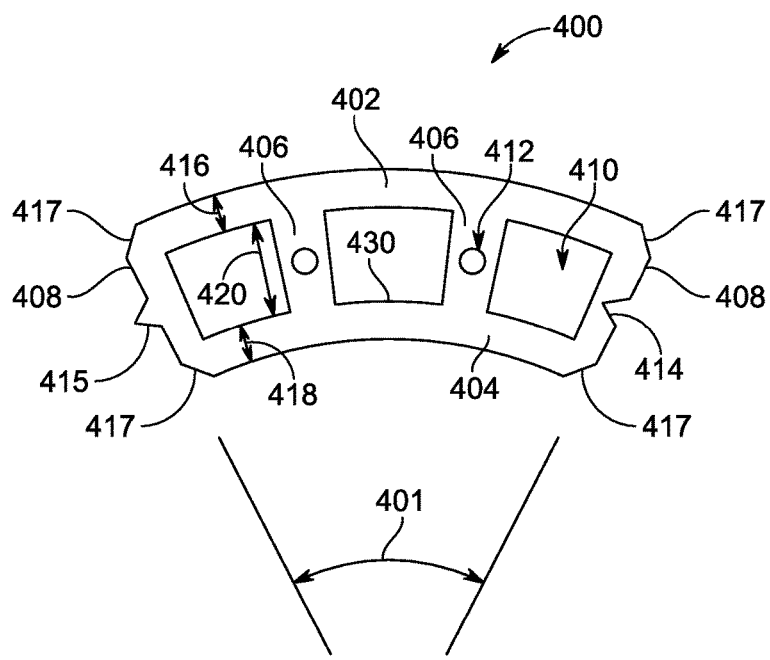

FIG. 4

500 (End view of a shim tray assembly)
502 (Shim tray)
530 (Plurality of shims)
504 (Channel in shim tray)
506 (Sides of channel)
508 (Base of channel)
512 (Fasteners)
516 (Mounting surface of bottom side of the base 508)
532 (Mounting holes corresponding to the mounting holes 514)

WARM BORE CYLINDER ASSEMBLY

STATEMENT REGARDING FEDERALLY SPONSORED RESEARCH & DEVELOPMENT

This invention was made with Government support under contract number R01EB010065 awarded by the National Institute of Health (NIH). The Government has certain rights in this invention.

BACKGROUND

Magnetic Resonance Imaging (MRI) systems typically include a superconducting magnet that generates a primary magnetic field within an imaging volume. To maintain superconductivity, the coils of the superconducting magnet must be kept at a very low temperature. Typically this is achieved via a coolant, such as liquid helium, with the superconducting magnet kept in a vacuum assembly to help insulate the superconducting magnet.

MRI systems also include a gradient magnet interposed between the superconducting magnet and an object to be imaged. The gradient magnet is typically pulsed so that a magnetic field varies at a relatively high frequency. To prevent the gradient magnetic field from affecting the superconducting magnet, one or more shielding layers may be interposed between the superconducting magnet and the gradient magnet. For example, a warm bore cylinder may be placed proximate an inner boundary of a housing of a superconducting magnet. In certain known systems, the warm bore cylinder is a thin, solid sleeve made of a conductive material. The conductive material allows the generally steady magnetic field of the superconducting magnet to pass thereby, but acts as a shield against the pulsing magnetic field of the gradient coil.

The pulsing magnetic field of the gradient coil results in eddy currents being created in the shielding, such as the warm bore cylinder. The formation of these eddy currents allows the warm bore cylinder to help dissipate the magnetic field of the gradient coil before the gradient coil magnetic field can affect the superconducting magnet. However, as the magnetic field increases, and the eddy currents increase, the eddy currents interact with the ambient magnetic field and cause the warm bore cylinder (or other shielding) to mechanically vibrate at an increasing magnitude. In addition to noise and potential mechanical failure, these vibrations may result in additional eddy currents and magnetic fields that propagate through the magnet's structure. Thus, the superconducting magnet becomes heated. The effects may be exacerbated by, for example, higher magnetic field, higher gradient power, and/or frequency matching between the gradient pulse and mechanical resonance modes of the conductive cylinders. This heating can affect the magnetic field produced by the superconducting magnet (and thus the quality of the image obtained), and even lead to quenching of the superconducting magnet (a damaging and potentially dangerous event including boiling of the liquid helium).

BRIEF DESCRIPTION

In one embodiment, a warm bore cylinder assembly for a cryostat is provided. The assembly includes an outer wall, an inner wall, and a plurality of braces. The outer wall is configured to define an inner exterior portion of a cryostat assembly. The outer wall is generally cylindrical, is made of a conductive material, and has an outer wall thickness. The inner wall is disposed radially inwardly of the outer wall. The inner wall is generally cylindrical, is made of a conductive material, and has an inner wall thickness. The braces extend along an axial direction defined by the outer wall and the inner wall. The plurality of braces are interposed between and join the outer wall and inner wall. The plurality of braces define openings disposed between adjacent braces.

In another embodiment, a cryostat assembly is provided. The cryostat assembly includes an outer cylinder, an inner cylinder, and end caps. The outer cylinder is configured to define an outer exterior portion of the cryostat assembly. The inner cylinder is disposed radially inwardly from the outer cylinder, and is configured to define an inner exterior portion of the cryostat assembly. The inner cylinder includes an outer wall, an inner wall, and a plurality of braces. The outer wall is configured to define the inner exterior portion of the cryostat assembly. The outer wall is generally cylindrical, is made of a conductive material, and has an outer wall thickness. The inner wall is disposed radially inwardly of the outer wall. The inner wall is generally cylindrical, is made of a conductive material, and has an inner wall thickness. The braces extend along an axial direction defined by the outer wall and the inner wall. The plurality of braces are interposed between and join the outer wall and inner wall. The plurality of braces define openings disposed between adjacent braces. The end caps are disposed on opposite ends of the cryostat assembly, and cooperate with the outer cylinder and inner cylinder to define an enclosed chamber configured to house a superconducting magnet. The end caps are joined to the outer wall of the inner cylinder with the openings disposed between the braces of the inner cylinder disposed at least partially radially inwardly of an edge of at least one end cap, wherein the openings are accessible from outside of the enclosed chamber.

In a further embodiment, a method for assembling a cryostat assembly is provided. The method includes providing an outer cylinder configured to define an outer exterior portion of the cryostat assembly. The method also includes providing an inner cylinder. The inner cylinder includes an outer wall, an inner wall, and a plurality of braces. The outer wall is configured to define an inner exterior portion of the cryostat assembly. The outer wall is generally cylindrical, is made of a conductive material, and has an outer wall thickness. The inner wall is disposed radially inwardly of the outer wall. The inner wall is generally cylindrical, is made of a conductive material, and has an inner wall thickness. The braces extend along an axial direction defined by the outer wall and the inner wall. The plurality of braces are interposed between and join the outer wall and inner wall. The plurality of braces define openings disposed between adjacent braces. The method further includes positioning a superconducting magnet assembly between the outer cylinder and inner cylinder. Also, the method includes joining the inner cylinder and outer cylinder with the end caps to define an enclosed chamber housing the superconducting magnet assembly, wherein the end caps are joined to the outer wall of the inner cylinder with the openings disposed between the braces of the inner cylinder disposed at least partially radially inwardly of an edge of at least one end cap, wherein the openings are accessible from outside of the enclosed chamber.

BRIEF DESCRIPTION OF THE DRAWINGS

FIG. 4 is an end view of a warm bore cylinder segment assembly in accordance with various embodiments.

DETAILED DESCRIPTION

Figure 1:
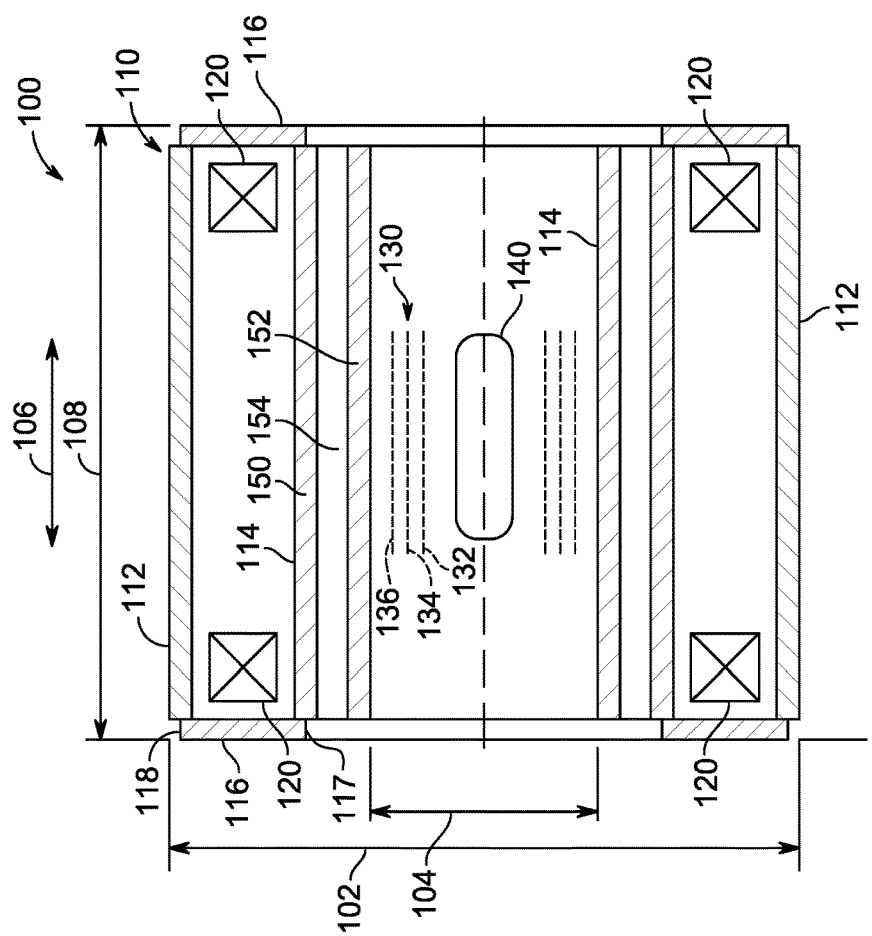
FIG. 1 is a side sectional view of a cryostat assembly in accordance with various embodiments.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Systems formed in accordance with various embodiments provide a warm bore inner cylinder with walls separated by braces for increased resistance to vibration. Systems formed in accordance with various embodiments provide a location for placing shim trays within a warm bore cylinder, for example in an opening defined between braces separating walls of the warm bore cylinder. A technical effect of at least one embodiment includes improved imaging, for example, by providing capability for increased strength of magnetic fields for imaging. A further technical effect of at least one embodiment is improved safety and repair costs (for example, improved protection of superconductive windings) by reducing the risk of quench, for example at increased magnetic field strengths. A further technical effect of at least one embodiment is the reduction or elimination of pulsed magnetic field energy that is transmitted to superconducting magnet windings through magnetomechanical coupling. A further technical effect of at least one embodiment is the reduction of noise from vibration. A further technical effect of at least one embodiment is the reduction of shim heating caused by gradient coils.

Figure 2:
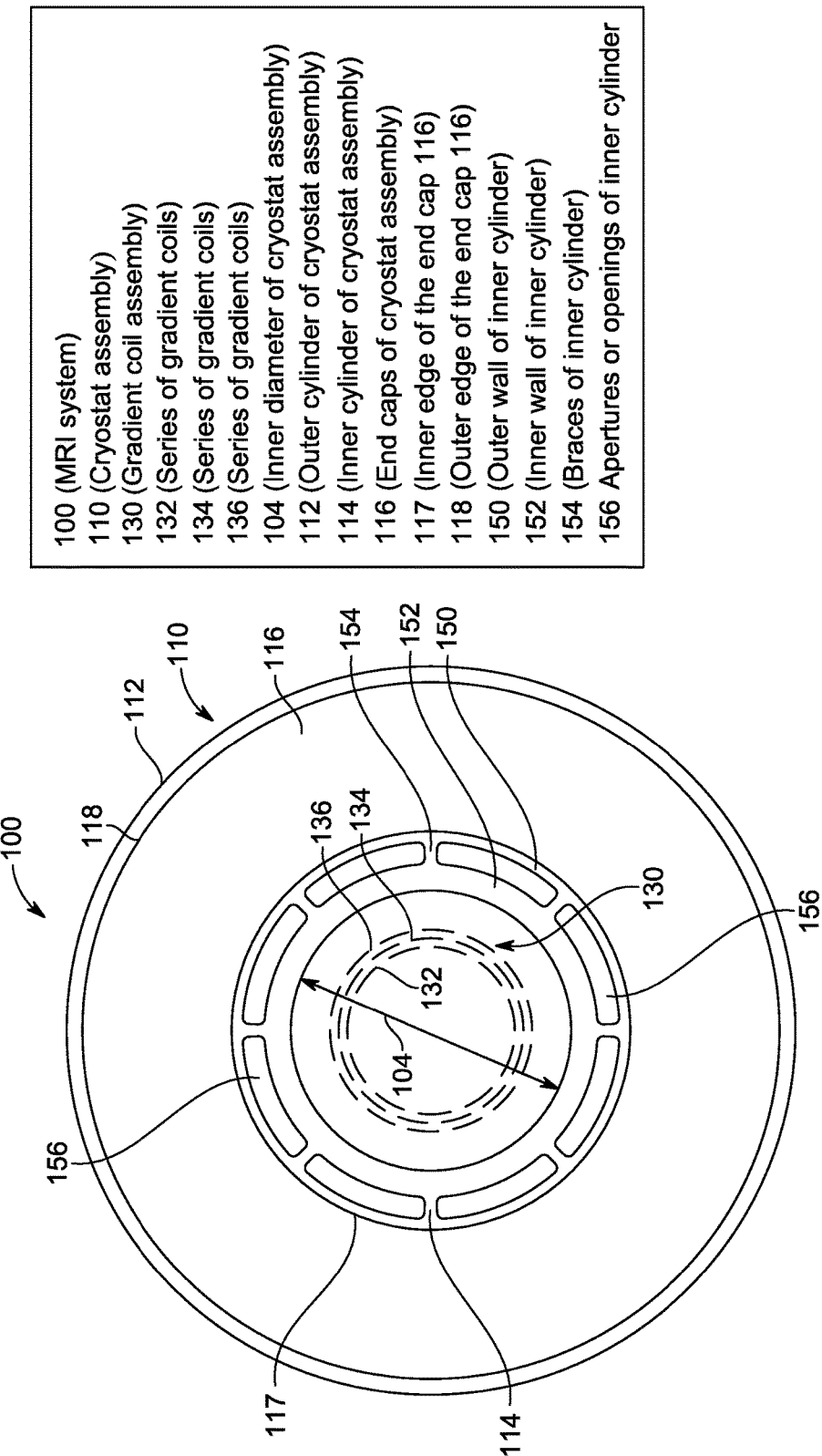
FIG. 2 is an end view of the cryostat assembly shown in FIG. 1 in accordance with various embodiments.

FIG. 1 is a side sectional view of a magnetic resonance imaging (MRI) system 100 formed in accordance with various embodiments, and FIG. 2 is an end view of the system 100. The system 100 includes a cryostat assembly 110, a superconducting magnet assembly 120, and a gradient coil assembly 130. The system 100 is configured to acquire data for reconstructing an image corresponding to an object 140 being imaged. The system 100 may also include radio frequency (RF) coils placed proximate to the object 140 (not shown in FIG. 1 or 2). The object 140 may be for example, a region or aspect of interest of a patient, such as, for example, a head, or as another example, a knee.

The cryostat assembly 110 is configured to house the superconducting magnet assembly 120. For example, the cryostat assembly 110 may define a first vessel contained within a second vessel. The first vessel may house the superconducting magnet along with structures and/or equipment and/or materials for mounting and cooling the superconducting magnet coils. The second vessel may surround the first vessel and be evacuated to provide insulation for the superconducting magnet assembly. In alternate embodiments, other arrangements are provided.

The cryostat assembly 110 of the illustrated embodiment is generally annular or cylindrical in configuration. The cryostat assembly 110 defines an outer diameter 102 and an inner diameter 104. The inner diameter 104 is sized to allow for placement of the gradient coil assembly 130 and object 140 (along with RF coils) within a bore defined by the inner diameter 104. The cryostat assembly 110 extends lengthwise along an axial direction 106. For example, in some embodiments, the length 108 may be about 1.5 meters.

The cryostat assembly 110 includes an outer cylinder 112, an inner cylinder 114, and end caps 116. The outer cylinder 112, inner cylinder 114, and end caps 116 are joined to define an enclosed chamber for housing the superconducting magnet assembly 120 and, for example, providing a vacuum surrounding the superconducting magnet assembly 120.

The inner cylinder 114 is disposed radially inwardly from the outer cylinder 112. The end caps 116 are positioned on opposite axial ends of the cryostat assembly 110. A portion of each end cap 116 is joined to axially outwardly located portions of the inner cylinder 114 and outer cylinder 112 to define a chamber therebetween. Thus, in the illustrated embodiment, the end caps 116 help define axial boundaries of the cryostat assembly 110, the outer cylinder 112 defines a radially outwardly located exterior portion of the cryostat assembly 110, and the inner cylinder 114 defines a radially inward exterior portion of the cryostat assembly. The chamber defined by the cryostat assembly is generally annular and cylindrical in shape, bounded axially by the end caps 116 and radially by the outer cylinder 112 and the inner cylinder 114.

The outer cylinder 112 defines a radially outward boundary of the cryostat assembly 110. The outer cylinder 112 in the illustrated embodiment is a generally cylindrical structure having a generally solid and uniform cross section. The outer cylinder 112 is configured for joining to the end caps 116 to provide a vacuum tight enclosure within the cryostat assembly 110. For example, in some embodiments, the outer cylinder 112 may be welded to the end caps 116. In addition to helping form a vacuum enclosure, the outer cylinder 112 may also function as a mounting location for support structures for the superconducting magnet assembly 120 and/or support structures for an inner vessel. In various embodiments, the support structures are made of an insulating material. The outer cylinder 112 and/or the end caps 116 may also provide passageways for access to the superconducting magnet assembly 120. The outer cylinder 112 may have additional shielding and/or thermally insulating layers or members mounted thereto or positioned proximately to the outer cylinder 112.

The inner cylinder 114 is disposed radially inward of the outer cylinder 112. As the inner cylinder 114 defines a radially inward or inner exterior portion of the cryostat assembly 110, with the volume disposed radially inward of the inner cylinder 114 (e.g. within the inner bore of the inner cylinder 114) not kept at the low temperatures required for superconducting, the inner cylinder 114 may also be known as a warm bore cylinder, or warm bore. The inner cylinder 114, for example, may define an inner diameter 104 that is sized to allow for placement of the gradient coil assembly 130 and object 140 (along with RF coils such as surface coils). For example, in embodiments, the inner diameter may be within a range of about 60 to about 95 centimeters.

The inner cylinder 114, or warm bore, may be sized, proportioned, and configured to help achieve several objectives. The inner cylinder 114 cooperates with the end caps 116 and the outer cylinder 112 to define a chamber for housing the superconducting magnet assembly 120. The inner cylinder 114 may also function as a mounting location for support structures for the superconducting magnet assembly and/or support structures for an inner vessel. In embodiments, the support structures are made of an insulating material. The inner cylinder 114 and/or the end caps 116 may also provide passageways for access to the superconducting magnet assembly 120. The inner cylinder 114 may have additional shielding and/or thermally insulating layers or members mounted thereto or positioned proximately to the inner cylinder 114.

Further, the inner cylinder 114 is configured as a shield to prevent or minimize the magnetic field created by the gradient coil assembly 130 from reaching or affecting the superconducting magnet assembly 120. In the illustrated embodiment, the inner cylinder 114 is at least partially comprised of an electrically conductive material. As examples, the inner cylinder 114 may be entirely or partially formed of copper, aluminum, or stainless steel. These materials, when exposed to a pulsing magnetic field, such as the field provided by the gradient coil assembly 130, develop eddy currents. These eddy currents help dissipate the magnetic field. Thus, the inner cylinder 114 may act to shield a volume disposed radially outward of the inner cylinder 114 (e.g. the chamber defined by the cryostat assembly 110 housing the superconducting magnet assembly 120). In some embodiments, other conductive cylinders and structures, for example, a radiation shield or thermal shield, or as another example, a helium vessel, may also help dissipate the magnetic field of the gradient coil. In certain known designs, at greater field strengths, for example about 1.5 Tesla, or as another example, 3 Tesla (the strength of field at which vibration becomes increasingly problematic may vary based on the particular configuration of the system), the warm bore may vibrate under influence of the greater magnetic field. The vibration in turn may create an additional magnetic field that propagates to the cryostat, causing current, which results in heat, and eventually quench.

The inner cylinder 114 defines a radially inward boundary of the cryostat assembly 110. The inner cylinder 114 in the illustrated embodiment is a generally cylindrical structure having walls separated by braces. The inner cylinder 114 is configured for joining to the end caps 116 to provide a vacuum tight enclosure within. For example, in embodiments, the inner cylinder 114 is welded to the end caps 116.

The inner cylinder 114 includes an outer wall 150, an inner wall 152, and braces 154. The outer wall 150 is disposed radially outwardly of the inner wall 152. The outer wall 150 and the inner wall 152 are joined by the braces 154. The braces 154 are disposed at intervals about the circumference of the inner cylinder 114, thereby defining apertures or openings 156. In the illustrated embodiment, the openings 156 are bounded radially by the outer wall 150 in a radially outward direction and by the inner wall 152 in a radially inward direction. The openings 156 are bounded laterally by adjacent braces 154. As seen in FIG. 2, in the illustrated embodiment there are 8 braces 154 defining 8 openings 156. Other numbers of braces and openings may be employed in other embodiments. For example, in other embodiments, a greater number of braces (and openings having reduced width than depicted in FIG. 2) may be present. For example, in embodiments between 16 and 36 openings may be provided.

In the illustrated embodiment, the braces 154 are generally pillar shaped in cross section and run axially along substantially the entire length of the outer wall 150 and the inner wall 152 of the inner cylinder 114. In various embodiments, the braces may have a different cross section, for example an "X" shape. In some embodiments, some or all of the braces may be discontinuous axially or otherwise may not span the entire length of the inner cylinder 114, for example for ease of construction and/or mounting and/or access to portions of the inner cylinder 114 and/or the cryostat assembly 110 either during assembly or operation of the cryostat assembly 110.

The inner cylinder 114 may be constructed substantially of a single material. For example, the outer wall 150, inner wall 152, and braces 154 may be constructed of the same conductive material. In some embodiments, the inner cylinder 114 may be formed integrally from a single piece, for example by extruding. In alternate embodiments, a plurality of pieces may be joined to form the inner cylinder 114. For example, arcuate segments may be joined to form the inner cylinder. Additionally or alternatively, two or more pieces of a shorter length than the inner cylinder 114 may be positioned axially adjacent to each other and then joined to form a piece of a greater length. For example, a series of shorter cylinders may be joined to form the inner cylinder 114, or a series of shorter arcuate segments may be joined to form an arcuate segment having the same length as the inner cylinder 114, with a plurality of such arcuate segments then joined to form the inner cylinder 114. Still further additionally or alternatively, a separate inner cylinder (or arcuate segment corresponding to a portion of the inner cylinder) may be positioned inside of the outer cylinder (or arcuate segment corresponding to a portion of the outer cylinder) with braces interposed between the inner and outer cylinder, with the assembly then joined, for example by welding the various components together. In embodiments, aspects of the inner cylinder 114 may be comprised of different materials, for example, a laminate arrangement. For example, the inner and outer cylinders may be comprised of a conductive material while the braces may be comprised of a thermally and/or electrically insulating material.

The inner cylinder 114 is sized, proportioned, and/or configured to shield the superconducting magnet assembly 120 from the pulsing magnetic field created by the gradient coil assembly 130 and the effects of the pulsing magnetic field. For example, in the illustrated embodiment, the thickness of the outer wall 150 and the inner wall 152 are selected to provide a sufficient amount of conductive material to dissipate the pulsing magnetic field through eddy currents formed in the outer wall 150 and the inner wall 152. Further, the inner cylinder 114 is sized, proportioned, and/or configured to reduce, minimize, or prevent vibrations caused by the pulsing magnetic field of the gradient coil assembly 130. In the illustrated embodiment, the distance at which the outer wall 150 and inner wall 152 are spaced (e.g. the height of the braces 154) is selected so that the inner cylinder 114 has a moment sufficient to maintain vibration at or below an acceptable level.

Space, particularly in the radial direction, is often at a premium in MRI systems. An inner cylinder 114 having inner and outer walls spaced apart as discussed above takes up more radial space than a cylinder having a single, thin wall. In embodiments, the space required for the spaced apart inner and outer walls is utilized by using the openings 156 defined in the inner cylinder 114 as a location at which to insert shim trays.

Shims may be utilized in MRI systems to adjust or fine tune the magnetic field provided by a main magnet, such as a superconducting magnet. For example, a magnetic field produced by a magnet may be studied to identify inhomogeneous field components. Passive shims, such as iron plates or bars, are then positioned to cancel out the inhomogeneous field components. These shims, for example, may be positioned in groups in shim trays which are then positioned within the magnetic field. In certain known systems, shim trays are placed between coils of gradient magnet assemblies. In other known systems, shim trays may be placed within the cryostat itself.

However, shims placed between gradient coils may be heated by the gradient coils, and the heating may affect the magnetic permeability of the shims. Also, gradient coils may present certain difficulties in mounting and securing the shim trays. For example, in systems where the gradient coils are not as long as the cryostat along an axial direction, shim trays may extend past the gradient coils and present mounting difficulties. In systems where shim trays are placed in the cryostat, obtaining access to the shim trays may be very difficult and/or time consuming.

Various embodiments advantageously position shim trays within the openings 156 defined by the braces 154 between the inner wall 152 and the outer wall 150 of the inner cylinder 114. Such placement utilizes at least a portion of the additional radial space consumed by the inner cylinder 114. For example, a portion of one or more openings 156 may be machined generally flat to provide a convenient placement surface(s) for a generally flat shim tray(s). In some embodiments, positioning of the shim trays in the openings of the inner cylinder may remove the shim trays from the gradient coils for improved structural support (for example, improved support along the length of the cryostat compared to the length of the gradient coil) as well as improved thermal management of the shims. Further, in some embodiments, positioning of shim trays within the openings 156 of the inner cylinder 114 provide for improved access, for example in comparison to systems having shims placed within a cryostat.

For example, as seen in FIG. 2, the openings 156 are accessible in an axial direction (e.g. out of the page as seen in FIG. 2). Thus, shim trays may be added to or removed from the system 100 without opening the cryostat assembly 114. In the illustrated embodiment, the openings 156 are positioned at least partially radially inward of an inward radial edge of at least one end cap 116. Thus, the openings 156 are accessible from an axial direction from outside of the system 100. In some embodiments, the openings may be accessible in an axial direction from either side of the cryostat (e.g. the openings are located at least partially radially inward from an inward edge of both end caps 116), or may be accessible only from one side (for example, one of the end caps 116 may define a generally solid disk like shape). In various embodiments, substantially the entirety of each opening is accessible in at least one axial direction. In other embodiments, for example, a portion of the openings 156 may be obstructed by a portion of the end cap 116, but enough of an opening 156 is accessible to allow placement or removal of a shim tray. In other embodiments, the openings may be covered by a removable portion of an end cap (such as a hatch or lid) that can be removed when access to the openings is desired. Thus, in various embodiments, shims may be conveniently positioned within an envelope defined by the inner cylinder 114, providing for convenient access, reducing space requirements, and providing for easier thermal management of shims.

Returning to FIG. 1, the end caps 116 provide an axial boundary for the cryostat assembly 110, and cooperate with the inner cylinder 114 and the outer cylinder 112 to define a chamber for housing the superconducting magnet assembly 120. For example, the end caps 116 may be welded to the inner cylinder 114 and the outer cylinder 112.

In the illustrated embodiment, the end cap 116 defines a generally ring-shaped or annular cross section, having an outer diameter about equal to or less than the outer diameter of the outer cylinder 112 (with the outer diameter of the end cap 116 about equal to or greater than an inner diameter of the outer cylinder 112), thus providing a convenient area for joining the end cap 116 to the outer cylinder 112. Further, the cross section of the generally ring-shaped or annular end cap 116 has an inner diameter that is less than an outer diameter of the inner cylinder 114, thereby providing a convenient area for joining the end cap 116 to the inner cylinder 114. In the illustrated embodiment, the inner diameter of the opening in the end cap 116 is less than the diameter of an outer surface of the outer wall 150 but greater than the diameter of an inner surface of the outer wall 150. Thus, the end cap 116 may be joined to the outer wall 150 of the inner cylinder 114 without blocking access in an axial direction to the openings 156.

As seen in FIGS. 1 and 2, the end cap 116 defines an outer edge 118 corresponding to an outer diameter of the end cap 116, and defines an inner edge 117 corresponding to the diameter of the opening through the center of the cross section of the end cap 116. Thus, the openings 156 in the illustrated embodiment are positioned radially inward of the inner edge 117 of the end cap 116. The end cap 116 thus does not block access to the openings 156 from an axial direction. In some embodiments, the end caps 116 may comprise sealable openings or portals to allow, for example, power or communication links to extend from inside the cryostat assembly 110 to outside of the system 100. In some embodiments, the end caps 116 on either side of the cryostat assembly 110 may be substantially identical, while in other embodiments, the end caps 116 may differ substantially from each other. For example, in some embodiments, one end cap 116 defines a generally annular shape having an inner opening permitting access in an axial direction to the openings 156, while the other end cap 116 may not permit access to the openings 156.

The superconducting magnet assembly 120 includes superconducting magnet coils and related structures or aspects, such as mountings, housings, and cooling apparatus and/or medium. The superconducting magnet assembly 120 provides a main magnetic field for the MRI system 100, and is housed in chamber defined in an interior of the cryostat assembly 110. For proper operation, the coils of the superconducting magnet must be kept at a low temperature, for example about 4 K. For example, liquid helium may be provided and maintained within the cryostat assembly 110 to maintain the coils of the superconducting magnet at or below a desired temperature. If however, the superconducting magnet assembly 120 is heated above the desired temperature, the superconducting magnet assembly will not function as efficiently, the magnetic field produced by the superconducting magnet assembly 120 will be reduced, and image quality will be adversely affected. Further, if the temperature rises sufficiently, the liquid helium may begin to boil off, and the superconducting magnet assembly may quench, a potentially dangerous situation.

The gradient coil assembly 130 in the illustrated embodiment includes a series of gradient coils 132, 134, and 136. The gradient coil assembly is configured to provide a pulsing magnetic field. The gradient coil assembly is disposed radially inwardly of the cryostat assembly 110, and radially outwardly of the object 140 being imaged. In the illustrated embodiment, the gradient coil assembly is devoid of structure for accepting or mounting shims, which in various embodiments provides for allowing a more compact gradient coil assembly. Also in the illustrated embodiment, the gradient coil 130 has a length along the axial direction 106 that is less than the length along the axial direction 106 of the cryostat assembly 110 and the superconducting magnet assembly 120. For example, the gradient coil 130 may be sized to provide a gradient magnet field for a particular portion of human anatomy, such as a head, while the cryostat assembly may be about 1.5 meters in length along the axial direction 106. Various embodiments provide gradient coil assemblies that are devoid of shim trays, providing for improved mounting (for example, improved access and/or improved stability of mounting) and/or improved thermal management of shim trays compared to systems that include shim trays disposed between gradient coils.

Figure 3:
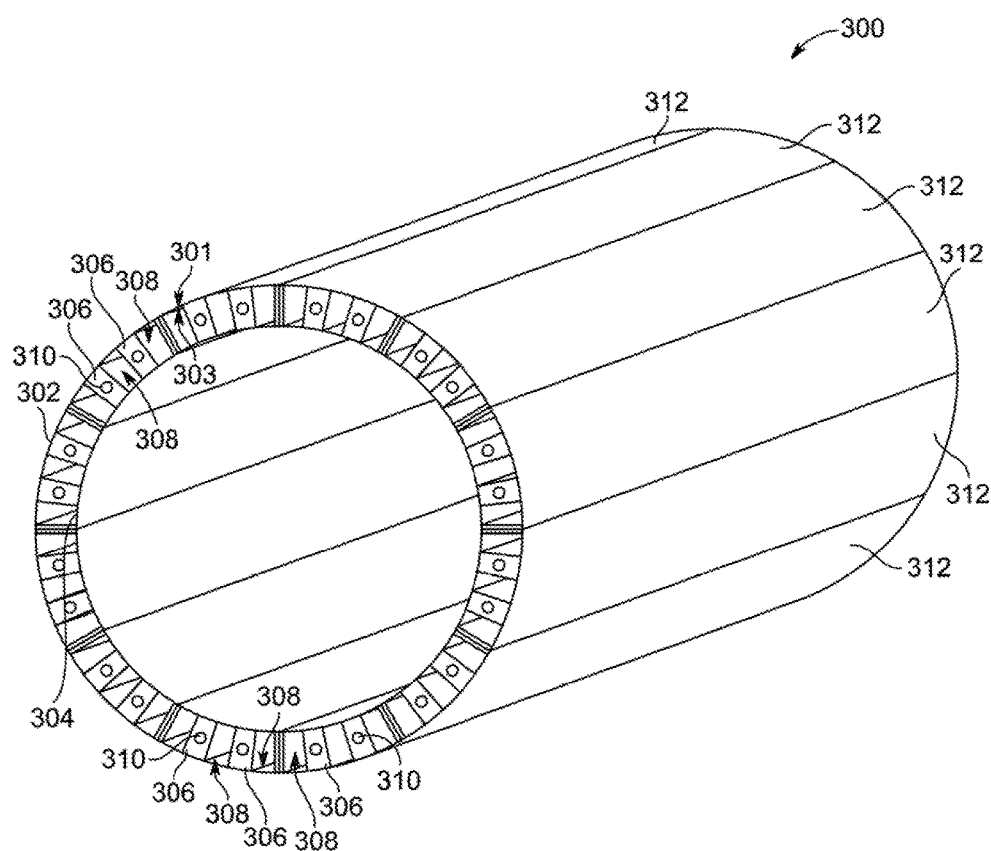
FIG. 3 is a perspective view of a warm bore cylinder assembly in accordance with various embodiments.

FIG. 3 is a perspective view of a warm bore cylinder 300 formed in accordance with various embodiments. The warm bore cylinder 300 includes an outer wall 302, an inner wall 304, and braces 306. The braces 306 join the outer wall 302 and inner wall 304 and maintain the outer wall 302 and inner wall 304 at a desired spacing 314. Openings 308 are defined between the braces 306.

The outer wall 302, for example, may be similar in certain respects to the outer wall 150 discussed above. The outer wall 302 is disposed radially outwardly on the warm bore cylinder 300 and positioned at or near an inner exterior boundary of a cryostat assembly (such as a cryostat assembly similar to the cryostat assembly 110) when the warm bore cylinder 300 is joined to the cryostat assembly. In some embodiments, the outer wall 302 forms a portion of a cryostat assembly and defines a radially inward (or inner) exterior portion of the cryostat. For example, the outer surface 301 of the outer wall 302 may be disposed inside of the chamber defined by the cryostat assembly (in some embodiments, insulation may be mounted to the outer surface 301) and the inner surface 303 of the outer wall 302 may be disposed outside of the volume of the chamber. The thickness of the outer wall may be selected to provide a desired structural rigidity and to provide a desired capability to dissipate a magnetic field created by a gradient coil associated with a system for which the warm bore cylinder 300 is configured. In the illustrated embodiment, the outer wall 302 is formed from a conductive material, such as, for example, copper or aluminum.

The inner wall 304, for example, may be similar in certain respects to the inner wall 152 discussed above. The inner wall 304 is disposed radially inwardly of the outer wall 302. The inner wall 304 is joined to the outer wall 302 and maintained a desired space from the outer wall 302 by the braces 306. The thickness of the inner wall 304 may be selected (in conjunction with the thickness of the outer wall 302) to provide a desired structural rigidity and to provide a desired capability to dissipate a magnetic field created by a gradient coil associated with a system for which the warm bore cylinder 300 is configured. For example, the combined thicknesses of the inner wall 304 and the outer wall 302 is selected to provide sufficient dissipation of the field (and shielding of the superconducting magnet assembly) created by the gradient coil of a system for which the warm bore cylinder 300 is configured, based on the material or materials used for the inner wall 304 and the outer wall 302. For example, a required skin depth, or total thickness required to sufficiently dissipate the anticipated gradient magnetic field (or the anticipated gradient magnetic field multiplied by a safety factor), may be determined, and the combined thicknesses of the inner wall 304 and outer wall 302 selected to correspond to the desired skin depth.

In various embodiments, a spacing between the inner wall 304 and outer wall 302 may then be selected, based on the thickness and material or materials of the inner wall 304 and outer wall 302 and a desired structural property, such as a moment, to sufficiently minimize any vibration of the warm bore cylinder 300 based on other features of the system for which the warm bore cylinder is configured, such as the strength and position of the various magnets of the system. In the illustrated embodiment, the inner wall 304 is formed from a conductive material, such as, for example, copper or aluminum. In some embodiments, the thickness of the outer wall 302 may be about 3-6 millimeters, the thickness of the inner wall 304 may be about 3-6 millimeters, and the inner wall 304 may be spaced about 6-12 millimeters radially inward of the outer wall 302.

The braces 306 connect or join the inner wall 304 and the outer wall 302 and maintain a desired distance between the inner wall 304 and outer wall 302. The braces 306 defined openings 308 disposed between adjacent braces 306. The height of the braces 306, which corresponds to the distance between the inner wall 304 and outer wall 302, may be selected to maintain expected vibrations caused by a MRI system for which the warm bore cylinder 300 is configured below a desired level. In some embodiments, the height of the braces 306 may also be selected to provide adequate spacing for insertion and removal of shim trays into the openings 308. In some embodiments, the braces 306 are made of the same material as one or more of the inner wall 304 and outer wall 302. In other embodiments, the braces 306 are made of a different material. For example, in some embodiments, the braces 306 are made of a non-conductive material. In various embodiments, a given brace 306 or braces 306 may be formed integrally with all or a portion of one or both of the outer wall 302 and the inner wall 304. In other embodiments, a given brace 306 or braces 306 may be formed separately from one or both of the outer wall 302 and the inner wall 304, and then joined, for example, as part of a laminate or composite assembly.

In the illustrated embodiment, the braces 306 are depicted as generally rectangular in cross section. In alternate embodiments other cross sectional shapes may be employed. For example, "X" shaped braces may be used. In the illustrated embodiment, the braces are generally uniformly distributed about the circumference of the warm bore cylinder 300 and the openings 308 are of generally uniform size. In other embodiments, the braces 306 may be nonuniformly distributed about the circumference of the warm bore cylinder 300 and the openings 308 may have non-uniform sizes.

In the illustrated embodiment, the openings 308 are located between braces 306. Each opening 308 is bounded circumferentially or laterally by adjacent braces 306, bounded radially inwardly by the inner wall 304, and bounded radially outwardly by the inner surface 303 of the outer wall 302. In some embodiments, one or more of the openings 308 are configured to accept a shim tray for adjustment of the main magnetic field. The openings 308, for example, may include a machined surface configured to accept a shim tray, and may include alignment, latching, positioning, locking, and/or securing features to help position and/or secure a shim tray in place.

In the illustrated embodiment, some of the braces 306 include coolant openings 310. In some embodiments, each brace may contain one or more coolant openings, while in other embodiments, no braces may include a coolant opening, while in still other embodiments, some braces may include a coolant opening while other braces do not include a coolant opening. The coolant openings 310 in the illustrated embodiment run axially along the entire length of the warm bore cylinder 300. For example, coolant may be introduced into one end of the warm bore cylinder 300 and removed through the opposite end of the warm bore cylinder 300. In alternate embodiments, coolant openings may not extend along the entire length, with send and return lines for the coolant having openings on the same end of the warm bore cylinder 300.

The coolant openings 310 are configured as passageways to allow the passage of a coolant, for example, water, to remove heat from the warm bore cylinder 300 and/or shims that may be positioned in the openings 308 defined between the braces 306. For example, as iron shims are exposed to the pulsing gradient field, the iron shims may heat, and the heat may be sufficient to affect the performance of the iron shims, thereby reducing the ability of the iron shims to correct any inhomogeneities that the shims were positioned to counteract. A coolant may be passed through the coolant openings 310 to remove heat energy and return the iron shims to a desired temperature or closer to the desired temperature for optimum performance.

In the illustrated embodiment, the warm bore cylinder 300 is formed by a series of segments 312 that have been joined together. In the illustrated embodiment, the segments 312 are arcuate segments having a truncated annular cross section, and are positioned about a circumference of the warm bore cylinder 300, with each segment 312 joined to adjacent segments 312, for example, by welding. In the illustrated embodiment, 12 segments 312 of uniform width across a circumference are used to form the warm bore cylinder. In alternate embodiments, other numbers of segments may be employed. Additionally or alternatively, segments having different or non-uniform widths may be employed.

In the illustrated embodiment, some of the braces 306 are contained entirely within a given segment 312, while other braces are shared between and formed proximate the boundary of adjacent segments 312. For example, an end wall of a first segment may be joined to a corresponding end wall of a second segment that is adjacent to the first segment. The two end walls, when joined, may cooperate to form a brace 306. In the illustrated embodiment, the segments 312 are each integrally formed, for example, by extrusion, and then the segments 312 are joined to form the warm bore cylinder 300.

The embodiment depicted in FIG. 3 is intended as illustrative only, as other construction or forming techniques may be used to form a warm bore cylinder in accordance with various embodiments. For example, the segments may each be made from two or more pieces. As examples, the segments may be laminated or fabricated from multiple pieces. Further, in some embodiments, the warm bore cylinder 300 may be formed as an extrusion. In further embodiments, the warm bore cylinder may comprise axial segments, with axial lengths of the warm bore cylinder 300 or axial lengths of arcuate segments first being formed and then subsequently joined to form the warm bore cylinder. In some embodiments, an inner cylinder may be provided, positioned within an outer cylinder, and then the inner and outer cylinders joined with braces. As yet one more example, portions may be machined away or otherwise removed from a workpiece to form the braces and the openings between the inner and outer walls.

FIG. 4 is an end view of a segment 400 formed in accordance with various embodiments. The segment 400 may be joined with a plurality of additional segments to form a warm bore cylinder, for example, similar to the inner cylinder 114 and/or the warm bore cylinder 300 discussed above. In the illustrated embodiment, the segment 400 has a generally uniform cross section that is generally arcuate and annular, corresponding to a portion of a circumference of a cylinder. The segment 400 includes a segment outer wall 402, a segment inner wall 404, braces 406, and end walls 408. The braces 406 extend radially between the segment outer wall 402 and the segment inner wall 404 and join and/or space the segment outer wall 402 and the segment inner wall 404. The end walls 408 define lateral (e.g. along the circumference) ends of the segment 400. In the illustrated embodiment, the segment 400 is integrally formed from a single workpiece, for example by an extrusion process, but other techniques may be used in other embodiments. The segment 400 may be formed integrally or may be constructed of a plurality of pieces or as a laminate assembly.

In the illustrated embodiment the segment 400 subtends an angle 401 of about 60 degrees, so that 6 segments 400 are used to construct a warm bore cylinder. In other embodiments, the segments may subtend a different angle and have a different number of segments used to make a warm bore cylinder. For example, in some embodiments 4 segments each subtending about 90 degrees may be joined, or, as another example, in some embodiments, 12 segments each subtending about 30 degrees may be joined to form a warm bore cylinder. Further, in the illustrated embodiment the segments subtend a generally uniform angle; however, in other embodiments the angle subtended by different segments may vary between two or more segments. In the illustrated embodiment, the segments are generally axially continuous, however, each segment in other embodiments may be comprised of axial sections formed separately and then joined.

The segment outer wall 402 cooperates with segment outer walls of other segments to which the segment 400 is joined to form an outer wall of a warm bore cylinder (such as, for example, the outer wall 302 of the warm bore cylinder 300). The segment inner wall 404 cooperates with segment inner walls of other segments to which the segment 400 is joined to form an inner wall of a warm bore cylinder (such as, for example, the inner wall 304 of the warm bore cylinder 300).

The segment outer wall 402 has a thickness 416 and the segment inner wall 404 has a thickness 418. In various embodiments, the thickness 416 and the thickness 418 are substantially the same. In other embodiments, the thickness 416 and the thickness 418 may differ from each other. The thicknesses 416 and 418 may be selected so that, based on the material used, the thicknesses 416, 418 are sufficient to dissipate a desired amount of pulsing magnetic field by eddy currents resulting in the segment 400 (or a warm bore cylinder including the segment 400). The distance 420 between the segment outer wall 402 and the segment inner wall 404 may then be selected to maintain vibration of the warm bore cylinder due to the pulsing magnetic field below a desired level. For example, in some embodiments, the thickness 416 is between about 3 and 6 millimeters, the thickness 418 is between about 3 and 6 millimeters, and the distance 420 is between about 6 to 12 millimeters.

In the illustrated embodiment, the end wall 408 of the segment 400 is configured to cooperate with a corresponding end wall of an adjacent segment 400 to which the end wall 408 is joined to form a brace. The depicted braces 406 of the segment 400 are contained entirely within the segment 400. Thus, a brace 406 may be unique to a segment or a brace formed by end walls 408 may be shared between adjacent segments.

The braces 406 define openings 410 disposed between adjacent braces 406, as well as disposed between a given brace 406 and adjacent end wall 408. The height of the braces 406 corresponds to the distance 420. In various embodiments, the height of the braces (e.g. the distance 420) as well as the spacing laterally (e.g. circumferentially) between the braces may also be sized to allow a desired number of shims to be stacked on a shim trays inserted into the openings 410. Further, one or more openings may define a shim tray surface 430 configured to accept a shim tray. For example, the shim tray surface 430 may be a machined flat surface or recessed surface sized to accept a shim tray. The shim tray surface 430 may include sides or rails configured to correspond to a width of the shim tray and help guide or maintain a shim tray in a desired orientation as the shim tray is inserted axially into an opening 410. Further still, the shim tray surface 430 (or a portion of the segment 400 proximate to the shim tray surface 430) may include a retaining, locking, and/or latching feature to releasably secure a shim tray in place.

The braces 406 include coolant openings 412 extending axially along at least a portion of the length of the braces 406. The coolant openings 412 are configured to provide a coolant flow passageway to provide improved thermal control of the warm bore cylinder temperature and/or the shim temperature of shims positioned in shim trays in the openings 410.

One end wall 408 of the segment 400 includes a notch 414, while the opposite end wall 408 includes a tab 415. The tab 415 is configured to be accepted by a notch 414 of an adjacent segment 400. The tab 415 and notch 414 of adjacent segments 408 help align and maintain the segments 400 in place when the segments 400 are joined. In the illustrated embodiment, the end walls 408 also comprise chamfers 417. The chamfers 417 are positioned on the exterior corners of the segment 400 and are configured to assist joining adjacent segments 400. For example, in some embodiments, the chamfers 417 of adjacent segments 400 may cooperate to provide a volume for deposition of welding material. For example, in some embodiments, adjacent segments 400 may be joined together with welds extending substantially along the full length of the adjacent segments 400. Other techniques for joining segments may be employed in alternate embodiments.

In the illustrated embodiment, the segment 400 is integrally formed from a single workpiece. For example, the segment 400 may be formed by extrusion. In other embodiments, the segment 400 may be constructed by different methods. For example, the segment 400 may be fabricated from a plurality of pieces welded together, or otherwise joined. In accordance with various embodiments, a warm bore cylinder may formed by segments joined circumferentially and/or axially. Portions of the segment 400 (e.g. segment outer wall 402, segment inner wall 404, braces 406, end walls 408) in various embodiments may be composed of the same material, and in other embodiments, portions of the segment 400 may be comprised of different materials than one or more other portions.

Figure 5:
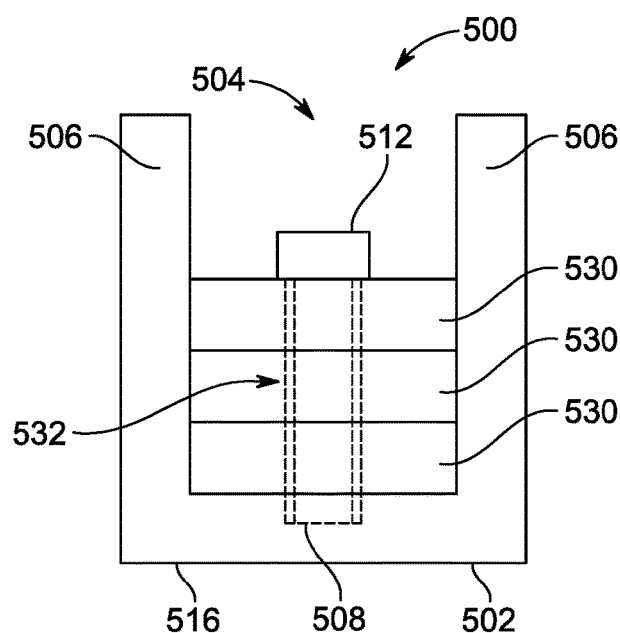
FIG. 5 is an end view of a shim tray assembly in accordance with various embodiments.
Figure 6:
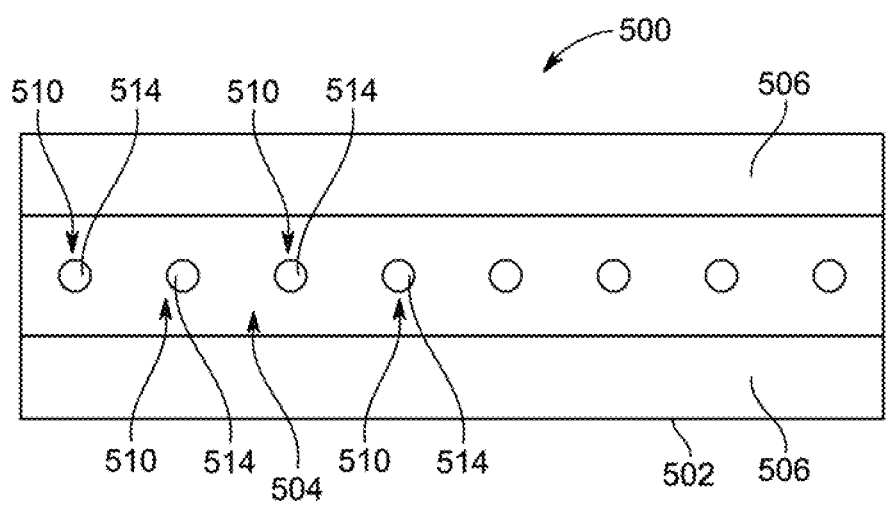
FIG. 6 is a plan view of the shim tray assembly of FIG. 5 in accordance with various embodiments.

FIG. 5 is an end view of a shim tray assembly 500, and FIG. 6 is a plan view of the shim tray assembly 500. In FIG. 5, shims are shown in place in the shim tray, while in FIG. 6 the shims are removed. The shim tray assembly 500 includes a shim tray 502 configured to accept a plurality of shims 530. The shim tray assembly 500 is configured to be accepted by and removably secured within an opening of a warm bore cylinder, such as, for example, the openings 308 extending between braces 306 of the warm bore cylinder 300. For example, a shim tray 502 may be inserted along an axial direction into an opening 308 of the warm bore cylinder 300 to a final desired position, and then secured in place, for example, by a latch or a fastener (not shown). The latch or fastener may be moved or removed to allow removal of the shim tray 500, for example, if further adjustments to a shim configuration are desired or required. In some embodiments, a plurality of shim tray assemblies 500 are disposed about the circumference of a warm bore cylinder, with each opening of the warm bore cylinder accepting a shim tray assembly 500. Thus, a shim tray configuration may describe shims in positions around the circumference of a cylinder as well as along the length of the cylinder, with a variable number of shims at each position.

The shim tray 502 includes a channel 504 defined by sides 506 and a base 508. The sides 506 are spaced to accept shims 530 therebetween, and the channel 504 has a depth sufficient to accept a plurality of shims 530. For example, each mounting location for shims 530 may be sized to accept up to 5 shims 530. In such an embodiment, between 0 and 5 shims 530 may be placed at any given shim mounting location 510. The bottom side of the base 508 includes a mounting surface 516. The mounting surface 516 is configured to cooperate with a corresponding surface of an opening in the warm bore cylinder, for example a surface 430 of a segment 400, to position the shim tray 502 in place. For example, the mounting surface 516 may comprise a machined surface sized and configured to be slidingly accepted by a machined pocket in the warm bore cylinder that acts to guide the shim tray 502 as the shim tray 502 is advanced axially into the warm bore cylinder. A locking or latching mechanism (not shown) may be used to secure the shim tray 502 in place.

As best seen in FIG. 6, the shim tray 502 includes mounting locations 510 along the length of the channel 504. The mounting locations 510 include corresponding mounting holes 514 that accept fasteners 512 (see FIG. 5). For example, the fasteners 512 may include threaded fasteners that pass through a mounting hole of a shim 530 and are accepted by a threaded mounting hole 514 in the channel 504. The fasteners 512, for example, may be of a sufficient length to pass through a plurality of shims 530. For example, the fasteners 512 may be of a sufficient length to pass through 5 shims 530. In the illustrated embodiment, the mounting locations 510 are uniformly sized and evenly distributed along the length of the channel 504. In alternate embodiments, mounting locations may be otherwise configured.

The shims 530 include mounting holes 532 corresponding to the mounting holes 514 of the shim tray 502 and are configured to accept fasteners 512 as described. The shims 530 may be arranged in stacks of varying height and secured to mounting locations 510 of the shim tray 502 to allow for adjustment of a magnetic field. Varying the height of each shim stack for each mounting location (e.g. the number of shims at any given mounting location) allows for adjustability along the axial length of an MRI system, while providing a plurality of shim trays along the circumference of the warm bore cylinder provides for adjustment along the circumference as well. For example, a main magnetic field may be energized with no shims in place and analyzed for inhomogeneities. Based on the inhomogeneities identified, a corrective shim pattern may be determined, for example via an appropriately programmed processor. The shim pattern may specify the number of shims at each mounting position, with each mounting position identified by an axial position along a length as well as a circumferential position (e.g. akin to the time position of a clock). The resulting field may then be tested for any inhomogeneities, and a new shim configuration determined. The process may be followed in an iterative fashion until the field is sufficiently uniform.

Figure 7:
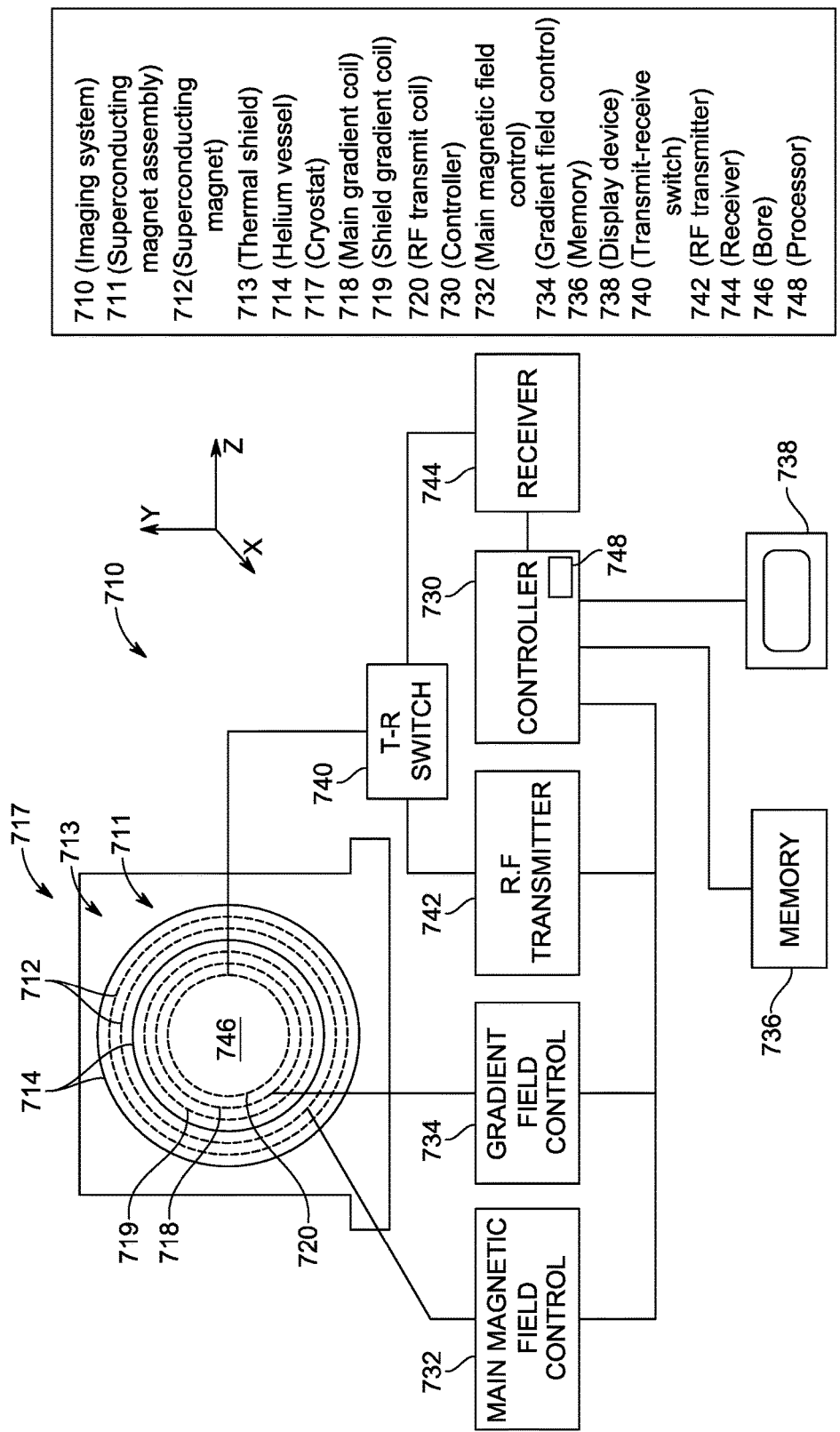
FIG. 7 is a schematic block illustration of an exemplary imaging system formed in accordance with various embodiments.

Various embodiments of the assemblies and methods described herein may be provided as part of, or used with, a medical imaging system, such as imaging system 710 shown in FIG. 7. It should be appreciated that although the imaging system 710 is illustrated as a single modality imaging system, the various embodiments may be implemented in or with multi-modality imaging systems. For example, the imaging system 710 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 710 includes a superconducting magnet assembly 711 that includes a superconducting magnet 712. The superconducting magnet 712 is formed from a plurality of magnetic coils supported on a magnet coil support structure. In one embodiment, the superconducting magnet assembly 711 may also include a thermal shield 713. A helium vessel 714 surrounds the superconducting magnet 712, and the thermal shield 713 surrounds the helium vessel 714. An outer vacuum vessel surrounds the thermal shield 713. The helium vessel 714, the thermal shield 713, and the outer vacuum vessel described above together form a cryostat 717. As discussed above, a warm bore cylinder is positioned proximate to an inner exterior portion of the cryostat 717, for example forming a part of or surrounding a radially inwardly located portion of the outer vacuum vessel. The warm bore cylinder may also be configured to accept shim trays as discussed above. In operation, the vessel 714 is filled with liquid helium to cool the coils of the superconducting magnet 712. A thermal insulation (not shown) may be provided in a space between the helium vessel 714 and the outer vacuum vessel. The imaging system 710 also includes a main gradient coil 718, a shield gradient coil 719, and an RF transmit coil 720. The imaging system 710 also generally includes a controller 730, a main magnetic field control 732, a gradient field control 734, a memory 736, a display device 738, a transmit-receive (T-R) switch 740, an RE transmitter 742 and a receiver 744.

In operation, a body of an object, such as a patient (not shown), or a phantom to be imaged, is placed in a bore 746 on a suitable support, for example, a motorized table (not shown) or other patient table. The superconducting magnet 712 produces a uniform and static main magnetic field $B_o$ across the bore 746. The strength of the electromagnetic field in the bore 746 and correspondingly in the patient, is controlled by the controller 730 via the main magnetic field control 732, which also controls a supply of energizing current to the superconducting magnet 712.

The main gradient coil 718, which may include one or more gradient coil elements, is provided so that a magnetic gradient can be imposed on the magnetic field $B_o$ in the bore 746 in any one or more of three orthogonal directions x, y, and z. The main gradient coil 718 is energized by the gradient field control 734 and is also controlled by the controller 730.

The RF transmit coil 720, which may include a plurality of coils (e.g., resonant surface coils), is arranged to transmit magnetic pulses and/or optionally simultaneously detect MR signals from the patient, if receive coil elements are also provided. The RE transmit coil 720 and the receive surface coil, if provided, may be selectably interconnected to one of the RE transmitter 742 or receiver 744, respectively, by the T-R switch 740. The RF transmitter 742 and T-R switch 740 are controlled by the controller 730 such that RF field pulses or signals are generated by the RE transmitter 742 and selectively applied to the patient for excitation of magnetic resonance in the patient.

Following application of the RF pulses, the T-R switch 740 is again actuated to decouple the RF transmit coil 720 from the RE transmitter 742. The detected MR signals are in turn communicated to the controller 730. The controller 730 includes a processor 748 that controls the processing of the MR signals to produce signals representative of an image of the patient. The processed signals representative of the image are also transmitted to the display device 738 to provide a visual display of the image. Specifically, the MR signals fill or form a k-space that is Fourier transformed to obtain a viewable image. The processed signals representative of the image are then transmitted to the display device 738.

During operation, when the main gradient coil 718 is electrically pulsed, the resulting time changing magnetic flux in any of the electrically conducting cylinders surrounding the main gradient coil 718 induces eddy currents. These eddy currents in turn may produce their own magnetic fields, which degrade the quality of the desired gradient field in space and time. Accordingly, in the exemplary embodiment, the imaging system 710 may also include a gradient shield coil 713 to compensate for the pulse sequences. The gradient shield coil 713 sets up fields that counteract the fields generated by the main gradient coil 718 in the region outside of the shield coil 713, thus reducing any mutual inductance with conducting members, such as the thermal shields, and reducing the resultant eddy currents.

Figure 8:
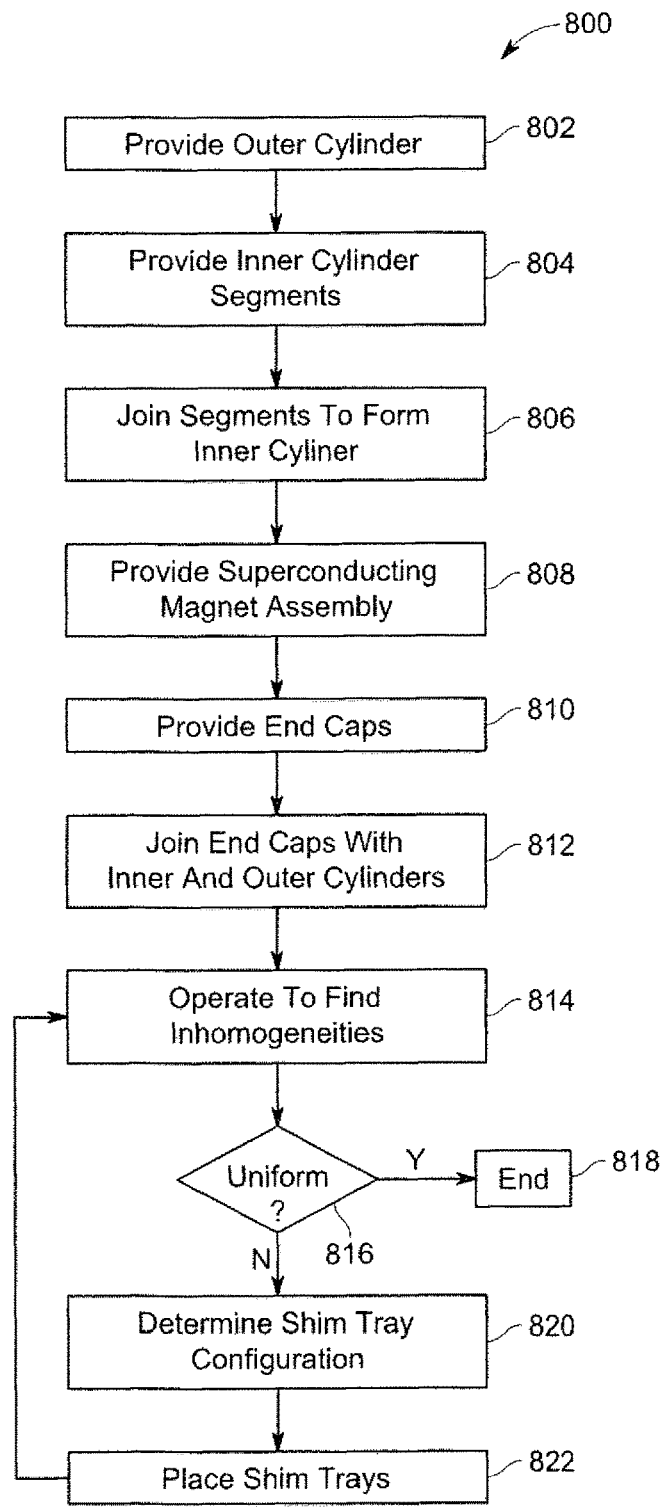
FIG. 8 is a flowchart of an exemplary method for assembling a cryostat assembly for a magnetic resonance imaging (MRI) system in accordance with various embodiments.

FIG. 8 is a flow chart of a method 800 for assembling a superconducting magnet assembly. The method 800, for example, may employ structures or aspects of various embodiments discussed above. In various embodiments, certain steps may be omitted or added, certain steps may be combined, certain steps may be performed simultaneously, or concurrently, certain steps may be split into multiple steps, certain steps may be performed in a different order, or certain steps or series of steps may be re-performed in an iterative fashion.

At 802, an outer cylinder is provided. The outer cylinder is sized and configured to provide a radially outward external portion of a cryostat. In some embodiments, the outer cylinder is a generally thin walled solid cylinder. The outer cylinder may also include mounting locations or structure or support structures for an inner vessel configured to maintain a low temperature, such as a vessel configured to hold liquid helium.

At 804, inner cylinder segments are provided. The inner cylinder segments may be configured to be joined circumferentially and/or axially to form a warm bore cylinder. The inner cylinder segments, for example, may include arcuate segments subtending a generally uniform angle. For example, 6 segments each subtending about 60 degrees may be provided. Each segment may include a segment outer wall and a segment inner wall separated by one or more braces and/or end walls. For example, each segment may be integrally formed from a single workpiece, for example by extrusion. In other embodiments, a segment outer wall, a segment inner wall, and one or more braces may be joined, for example by welding, to form a segment. The braces define opening disposed between the braces. In some embodiments, the openings are sized and configured to accept shim trays.

At 806, the segments are joined to form an inner cylinder, or warm bore cylinder. The inner cylinder is sized and configured to allow for placement of gradient coils, RF coils, and an object to be scanned (e.g. a patient or a portion of a patient) to be disposed radially inward of the inner cylinder. The segments may be positioned adjacent to each other to define a cylinder and joined by welding along all or a portion of an axial length of the segments. Further, segments or cylinders may be positioned adjacent to each other axially and joined to form a longer segment or cylinder. In alternate embodiments, the warm bore cylinder may not be formed by joining segments as discussed above. For example, a generally cylindrical inner wall may be positioned inside a generally cylindrical outer wall with braces interposed therebetween, and the assembly joined, for example, by welding. In still other embodiments, the inner wall, outer wall, and beams may be integrally formed with other, for example by extrusion.

At 808, a superconducting magnet assembly is provided. The superconducting magnet may include superconducting coils along with various hardware and structures for the proper operation of the superconducting magnet. The superconducting magnet assembly is positioned radially inwardly of the outer cylinder, with the inner cylinder assembly positioned radially inwardly of the superconducting magnet assembly.

At 810, end caps are provided. For example, the end caps may define generally annular shapes. The end caps are configured to cooperate with the outer and inner cylinders to define a generally annular chamber for housing the superconducting magnet assembly. In some embodiments, the end caps are substantially similar, while in other embodiments the end caps are differently configured from each other. In some embodiments, at least one end cap is configured to allow access in an axial direction to the openings disposed between the braces of the inner cylinder.

At 812, with the superconducting magnet assembly interposed radially between the inner and outer cylinders, the end caps are positioned to define axial boundaries of the cryostat and joined with the inner and outer cylinders to form the cryostat. For example, the end caps may be welded to inner and outer cylinders.

At 814, the superconducting magnet assembly is activated and operated to determine or identify inhomogeneities in the magnetic field provided by the superconducting magnet assembly. At 816, it is determined if the field provided by the superconducting magnet is sufficiently uniform for a desired application. If the field is sufficiently uniform, then the method 800 may end at 818. If the field is not sufficiently uniform, the method may proceed to 820.

At 820, a shim configuration is determined. For example, a processor may utilize an appropriate computer program to analyze the field produced by the superconducting magnet assembly for inhomogeneities and identify the placement of shims to account for the inhomogeneities and provide a more uniform resulting field. The shims may be specified, for example, by amount (e.g. a number of shims to be stacked at a given location), as well as axial position (e.g. along the length of the cryostat) as well as circumferential position (e.g. an identification of an opening in the warm bore cylinder specified by position around the circumference, for example, an angle referenced from the horizontal).

At 822, in accordance with the shim configuration previously determined, the shims are positioned in shim trays, and the shim trays then inserted along an axial direction into warm bore cylinder openings. In various embodiments, each opening of the warm bore cylinder formed between the braces accepts one shim tray. With the shims in place, the method may return to 814, with the magnet assembly now operated with the newly positioned shim configuration to determine any resulting inhomogeneities in the magnetic field with the shim configuration in place. As before, if the field is sufficiently uniform, then the method 800 may end at 818. If the field is not sufficiently uniform, the method may proceed to 820 with a new shim configuration to modify the previous shim configuration determined.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose the various embodiments, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A warm bore cylinder assembly configured for a cryostat that is compatible with a Magnetic Resonance Imaging (MRI) system, the warm bore cylinder assembly comprising:
    an outer wall configured to define an exterior portion of the warm bore cylinder assembly, the outer wall being generally cylindrical, the outer wall being constructed from a conductive material and having an outer wall thickness;
    an inner wall disposed radially inwardly of the outer wall, the inner wall also being generally cylindrical, with the inner wall also being constructed from a conductive material and having an inner wall thickness, wherein both the outer wall thickness and inner wall thickness are sized in order to define a skin depth that is configured to substantially shield the cryostat, of the compatible MRI system, which is defined at least in part by the outer wall, from either a pulsing magnetic field, or eddy currents resulting from the pulsing magnetic field, wherein the pulsing magnetic field is provided by a gradient coil assembly of the compatible MRI system that is disposed radially inwardly from the inner wall;
    a plurality of braces extending along an axial direction defined by the outer wall and the inner wall, the plurality of braces being interposed between and joining the inner wall and outer wall, the plurality of braces also defining openings which are disposed between adjacent braces, wherein a height of the plurality of braces is sized and configured in order to provide structural support and vibrational support to the warm bore cylinder assembly, wherein at least one of the plurality of braces has a coolant passageway running therethrough;
    a shim tray configured to be slidingly accepted by and removably mounted within, at least one of the openings disposed between adjacent braces, the shim tray configured to accept an adjustable quantity of shims where the accepted quantity of shims alter a main magnetic field being provided by a superconducting magnet of the compatible MRI system disposed within the cryostat; and
    a plurality of arcuate segments cooperating with one another in order to form the inner wall and the outer wall, each arcuate segment comprising a segment of the outer wall and a segment of the inner wall joined by segment braces, each arcuate segment also comprising an end wall joined to a corresponding end wall of an adjacent arcuate segment, wherein the segment outer wall, segment inner wall, segment braces, and end wall are integrally formed for at least one of the plurality of arcuate segments.

2. A warm bore cylinder assembly in accordance with claim 1, wherein the braces are constructed from a different material than at least one of the outer wall and the inner wall.

3. A cryostat of a compatible MRI system comprising:
    an outer cylinder configured to define an outer exterior portion of the cryostat of the compatible MRI system;
    an inner cylinder disposed radially inwardly from the outer cylinder, the inner cylinder configured to define an inner exterior portion of the cryostat of the compatible MRI system, the inner cylinder being formed as an enclosed chamber comprising:
        an outer wall configured to define the inner exterior portion of the cryostat of a compatible MRI system, the outer wall being generally cylindrical, the outer wall being constructed from a conductive material and having an outer wall thickness;
        an inner wall disposed radially inwardly of the outer wall, the inner wall also being generally cylindrical, with the inner wall also being constructed from a conductive material and having an inner wall thickness, wherein both the outer wall thickness and inner wall thickness are sized in order to define a skin depth that is configured to substantially shield the enclosed chamber of the cryostat, from either a pulsing magnetic field, or eddy currents resulting from the pulsing magnetic field, wherein the pulsing magnetic field is provided by a gradient coil assembly of the compatible MRI system that is disposed radially inwardly from the inner wall of the inner cylinder; and
        a plurality of braces extending along an axial direction defined by the outer wall and the inner wall, the plurality of braces being interposed between and joining the inner wall and outer wall, the plurality of braces also defining openings which are disposed between adjacent braces, wherein a height of the plurality of braces is sized and configured in order to provide structural support and vibrational support to the warm bore cylinder assembly, wherein at least one of the plurality of braces has a coolant passageway running therethrough;
    end caps disposed on opposite ends of the cryostat and joining the outer cylinder and inner cylinder in order to define an enclosed chamber configured to house a superconducting magnet, the end caps being joined to the outer wall of the inner cylinder with the openings that are disposed between the braces of the inner cylinder also disposed at least partially radially inwardly of the outside edges of the end caps, wherein the openings that are disposed between the braces are accessible from outside of the enclosed chamber;
    a shim tray configured to be slidingly accepted by and removably mounted within, at least one of the openings disposed between adjacent braces, the shim tray configured to accept an adjustable quantity of shims where the accepted quantity of shims alter a main magnetic field being provided by a superconducting magnet of the compatible MRI system disposed within the enclosed chamber;
    a gradient coil assembly disposed radially inwardly of the inner wall of the inner cylinder; wherein the gradient coil assembly is devoid of a structure that is configured to accept a magnetic shimming assembly; and
    a plurality of arcuate segments cooperating with one another in order to form the inner wall and outer wall of the inner cylinder, each arcuate segment comprising a segment of the outer wall and a segment of the inner wall joined by segment braces, each arcuate segment also comprising an end wall joined to a corresponding end wall of an adjacent arcuate segment, wherein the segment outer walk, segment inner walk, segment braces, and end wall are integrally formed for at least one of the plurality of arcuate segments.

4. A warm bore cylinder assembly in accordance with claim 3, wherein the braces are constructed from a different material than at least one of the outer wall and the inner wall.

5. A method of assembling a cryostat of a compatible MRI system comprising:
- providing an outer cylinder configured to define an outer exterior portion of the cryostat of the compatible MRI system;
- providing an inner cylinder comprising:
  - an outer wall configured to define an inner exterior portion of the cryostat, the outer wall being generally cylindrical, constructed by a conductive material, and having an outer wall thickness;
  - an inner wall disposed radially inwardly of the outer wall, the inner wall also being generally cylindrical, constructed from a conductive material, and having an inner wall thickness; and
  - a plurality of braces extending along an axial direction defined by the outer wall and the inner wall, the plurality of braces being interposed between and joining the inner wall and outer wall, the plurality of braces also defining openings which are disposed between adjacent braces, wherein a height of the plurality of braces is sized and configured in order to provide structural support and vibrational support to the cylindrical structure of the outer and inner walls wherein the plurality of braces and at least one of the inner wall and outer wall are formed separately and subsequently joined;
- positioning a superconducting magnet assembly between the outer cylinder and inner cylinder;
- forming the inner cylinder from a plurality of arcuate segments, each arcuate segment comprising a segment outer wall and a segment inner wall that is joined by segment braces, each arcuate segment also comprising an end wall joined to a corresponding end wall of an adjacent arcuate segment, wherein the segment outer wall, segment inner wall, segment braces, and end wall are all integrally formed for at least one of the plurality of arcuate segments;
- joining the inner cylinder and outer cylinder with end caps in order to define an enclosed chamber housing the superconducting magnet assembly, wherein the end caps are joined to the outer wall of the inner cylinder with the openings which are disposed between the braces of the inner cylinder and also disposed at least partially radially inwardly of the outside edges of the end caps, wherein the openings are accessible from outside of the enclosed chamber;
- determining an inhomogeneity in a main magnetic field provided by the superconducting magnet assembly;
- determining a shim configuration in order to address the inhomogeneity;
- placing at least one shim tray in one of the openings disposed between the braces of the inner cylinder, the at least one shim tray having a shim arrangement defined by the shim configuration;
- determining with a computer processor a resulting inhomogeneity in the magnetic field with the shim configuration in place;
- determining with the computer processor an updated shim configuration in order to address the resulting inhomogeneity; and
- removing and adjusting the at least one shim tray and then replacing at least one shim tray into at least one of the openings disposed between the braces of the inner cylinder, the adjusted at least one shim tray having a shim arrangement defined by the updated shim configuration.

6. A warm bore cylinder assembly configured for a cryostat that is compatible with a Magnetic Resonance Imaging (MRI) system, the warm bore cylinder assembly comprising:
- an outer wall configured to define an exterior portion of the warm bore cylinder assembly, the outer wall being generally cylindrical, with the outer wall also being constructed from a conductive material and having an outer wall thickness;
- an inner wall disposed radially inwardly of the outer wall, the inner wall being generally cylindrical, with the inner wall also being constructed from a conductive material and having an inner wall thickness, wherein both the outer wall thickness and inner wall thickness are sized to define a skin depth that is configured to substantially shield the cryostat, of the compatible MRI system, which is defined at least in part by the outer wall, from either a pulsing magnetic field, or eddy currents resulting from the pulsing magnetic field, wherein the pulsing magnetic field is provided by a gradient coil assembly of the compatible MRI system that is disposed radially inwardly from the inner wall;
- a plurality of braces extending along an axial direction defined by the outer wall and the inner wall, the plurality of braces being interposed between and joining the inner wall and outer wall, the plurality of braces also defining openings which are disposed between adjacent braces, wherein a height of the plurality of braces is sized and configured in order to provide structural support and vibrational support to the warm bore cylinder assembly, and
- a shim tray configured to be slidingly accepted by and removably mounted within, at least one of the openings disposed between adjacent braces, the shim tray configured to accept an adjustable quantity of shims, where the accepted quantity of shims alter, a main magnetic field being produced by a superconducting magnet of the compatible MRI system disposed within the cryostat.

7. A warm bore cylinder assembly in accordance with claim 6, wherein at least one of the braces has a coolant passageway running therethrough.

8. A warm bore cylinder assembly in accordance with claim 6, further comprising a plurality of arcuate segments cooperating in order to form the inner wall and the outer wall, each arcuate segment comprising a segment outer wall and a segment inner wall joined by segment braces, each arcuate segment also comprising an end wall joined to a corresponding end wall of an adjacent arcuate segment.

9. A warm bore cylinder assembly in accordance with claim 8, wherein the segment outer wall, segment inner wall, segment braces, and end wall are integrally formed for at least one of the plurality of arcuate segments.

10. A warm bore cylinder assembly in accordance with claim 6, wherein the braces are constructed from a different material than at least one of the outer wall and the inner wall.

* * * * *